(12) United States Patent
Chen et al.

(10) Patent No.: US 7,859,025 B2
(45) Date of Patent: Dec. 28, 2010

(54) METAL ION TRANSISTOR

(75) Inventors: Fen Chen, Williston, VT (US); Armin Fischer, Munich (DE)

(73) Assignees: International Business Machines Corporation, Armonk, NY (US); Infineon Technologies North America Corporation, Milipitas, CA (US)

( * ) Notice: Subject to any disclaimer, the term of this patent is extended or adjusted under 35 U.S.C. 154(b) by 138 days.

(21) Appl. No.: 11/951,579

(22) Filed: Dec. 6, 2007

(65) Prior Publication Data

US 2009/0146242 A1   Jun. 11, 2009

(51) Int. Cl.
*H01L 45/00* (2006.01)

(52) U.S. Cl. .................. 257/212; 257/508; 257/235; 257/E45.001; 257/E45.002; 257/E45.003

(58) Field of Classification Search .......... 257/212, 257/508, 235, E45.001, E45.002, E45.003
See application file for complete search history.

(56) References Cited

U.S. PATENT DOCUMENTS

| | | |
|---|---|---|
| 5,753,947 A | 5/1998 | Gonzalez |
| 5,792,569 A | 8/1998 | Sun et al. |
| 5,970,336 A | 10/1999 | Wolstenholme et al. |
| 5,986,858 A | 11/1999 | Sato et al. |
| 6,110,751 A | 8/2000 | Sato et al. |
| 6,236,059 B1 | 5/2001 | Wolstenholme et al. |
| 6,376,284 B1 | 4/2002 | Gonzalez et al. |
| 6,424,041 B1 | 7/2002 | Oashi et al. |
| 6,436,817 B2 | 8/2002 | Lee |
| 6,544,801 B1 | 4/2003 | Slaughter et al. |
| 6,661,703 B1 | 12/2003 | Ikeda |
| 6,713,830 B2 | 3/2004 | Nishimura et al. |
| 6,721,201 B2 | 4/2004 | Ikeda |
| 6,757,187 B2 | 6/2004 | Hoenigschmid |
| 6,760,251 B2 | 7/2004 | Hidaka |
| 6,764,894 B2 | 7/2004 | Lowrey |
| 6,869,883 B2 | 3/2005 | Chiang et al. |
| 6,943,393 B2 | 9/2005 | Miethaner et al. |
| 6,943,394 B2 | 9/2005 | Yoshihara et al. |
| 6,944,049 B2 | 9/2005 | Hoenigschmid et al. |
| 6,980,468 B1 | 12/2005 | Ounadjela |

(Continued)

FOREIGN PATENT DOCUMENTS

JP   2002064190 A   3/2002

OTHER PUBLICATIONS

U.S. Appl. No. 11/625,607—Applicant: Chen, et al. Title: "A Programmable Resistor, Switch, or Vertical Memory Cell" filed Jan. 22, 2007.
Tondelier, et al., "Metal/organic/metal Bistable Memory Devices", Applied Physics Letters, Dec. 2004, vol. 85, No. 23, pp. 5763-5765.
Ma, et al., "Organic Nonvolatile Memory By Controlling the Dynamic Copper-Ion Concentration Within Organic Layer", Applied Physics Letters, Jun. 2004, vol. 84, No. 24, pp. 4908-4910.

(Continued)

*Primary Examiner*—Phat X Cao
*Assistant Examiner*—Diana C Garrity
(74) *Attorney, Agent, or Firm*—Joseph P. Abate; Hoffman Warnick LLC

(57) ABSTRACT

A metal ion transistor and related methods are disclosed. In one embodiment, the metal ion transistor includes a cell positioned in at least one isolation layer, the cell including a metal ion doped low dielectric constant (low-k) dielectric material sealed from each adjacent isolation layer; a first electrode contacting the cell on a first side; a second electrode contacting the cell on a second side; and a third electrode contacting the cell on a third side, wherein each electrode is isolated from each other electrode.

13 Claims, 9 Drawing Sheets

U.S. PATENT DOCUMENTS

| | | |
|---|---|---|
| 6,992,342 B2 | 1/2006 | Motoyoshi et al. |
| 7,038,261 B2 | 5/2006 | Horii |
| 7,482,288 B2 | 1/2009 | Penka et al. |
| 2002/0044396 A1 | 4/2002 | Amano et al. |
| 2003/0061958 A1* | 4/2003 | Zhang .................. 101/463.1 |
| 2003/0063491 A1 | 4/2003 | Ikeda |
| 2004/0160810 A1 | 8/2004 | Deak et al. |
| 2004/0183647 A1* | 9/2004 | Arai et al. ................. 338/13 |
| 2004/0217481 A1 | 11/2004 | Farrar |
| 2005/0151127 A1* | 7/2005 | Iwata et al. ................ 257/22 |
| 2007/0023917 A1* | 2/2007 | Yamada .................... 257/762 |

OTHER PUBLICATIONS

U.S. Appl. No. 11/625,607, filed Jan. 22, 2007, Notice of Allowance and Fees Due, dated Oct. 6, 2009.

U.S. Appl. No. 11/625,607, filed Jan. 22, 2007, Preliminary Amendment filed Jul. 22, 2008.

U.S. Appl. No. 11/625,607, filed Jan. 22, 2007, Notice of Non-Compliant Amendment dated Jul. 21, 2008.

U.S. Appl. No. 11/625,607, filed Jan. 22, 2007, Preliminary Amendment filed Jun. 26, 2008.

* cited by examiner

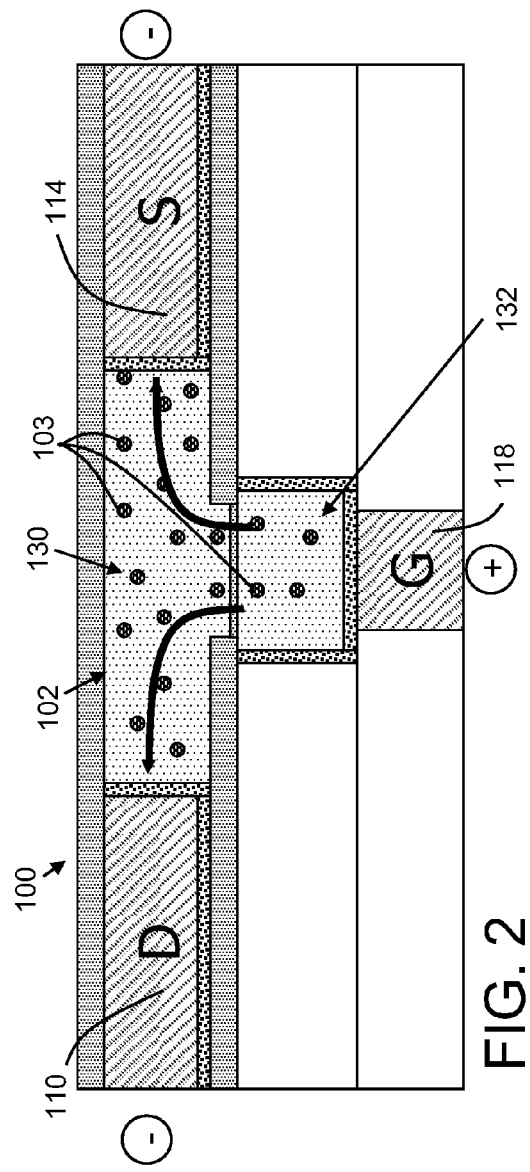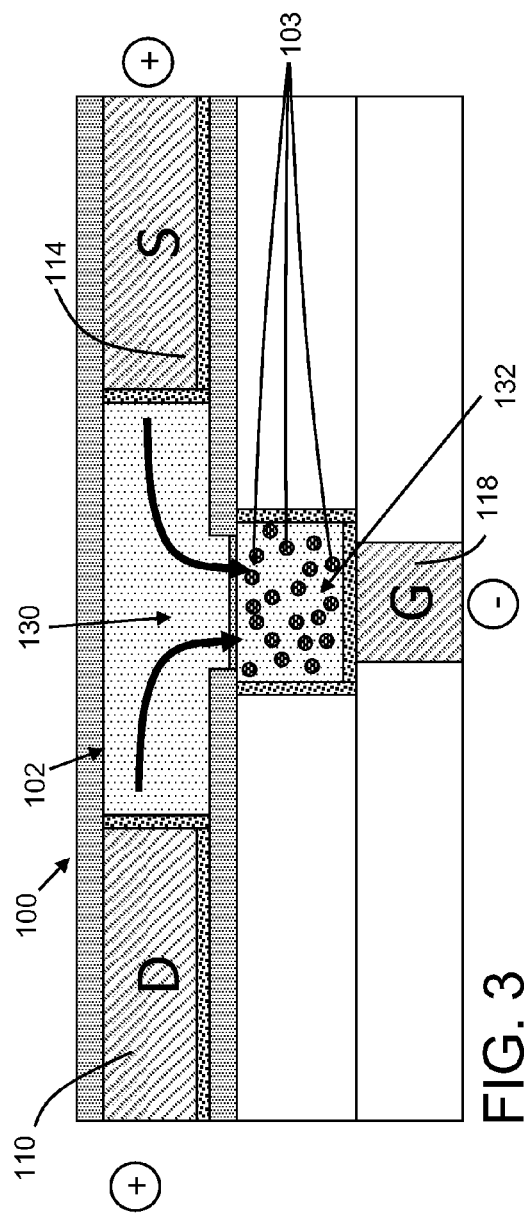

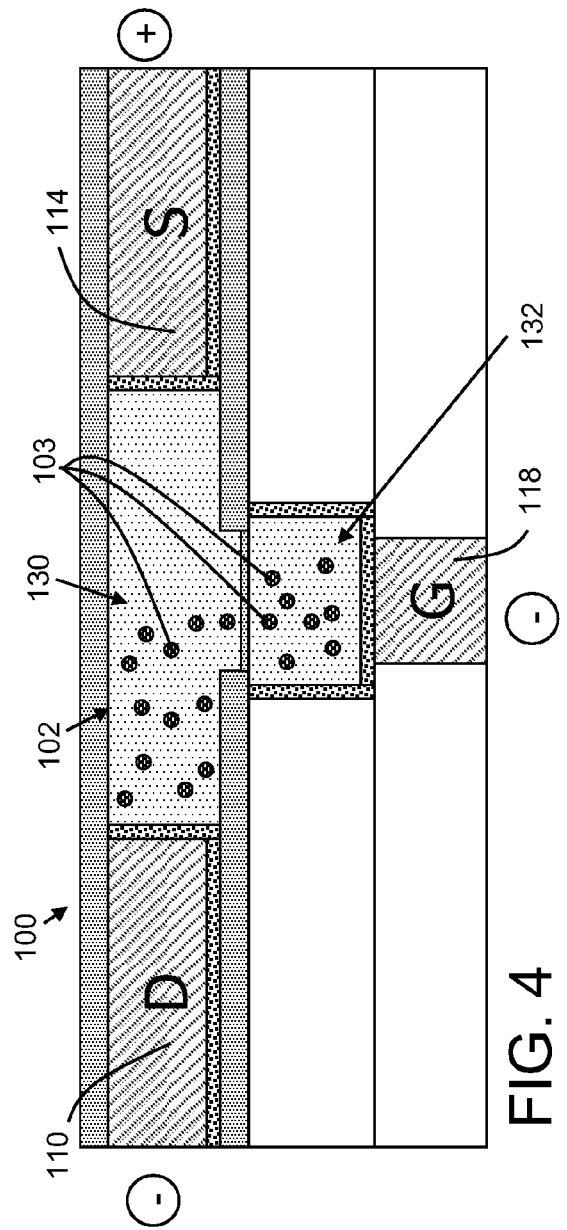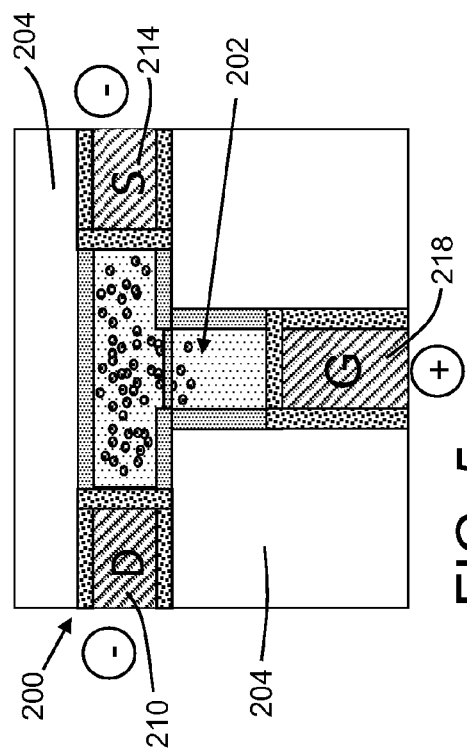
FIG. 4
FIG. 5

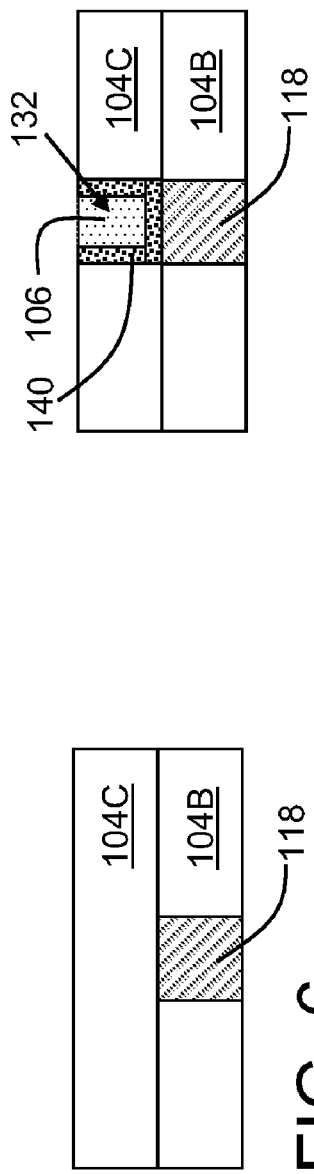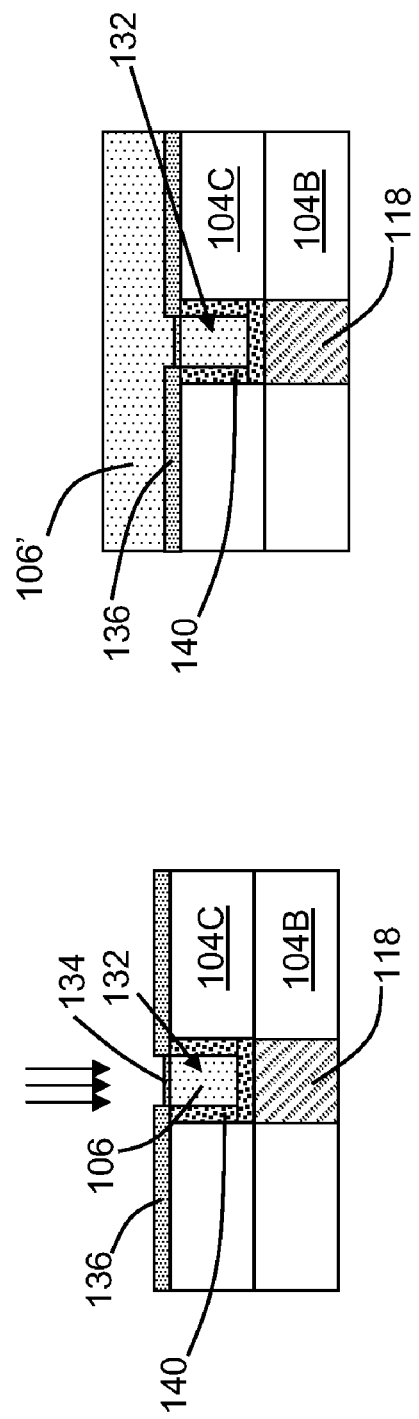

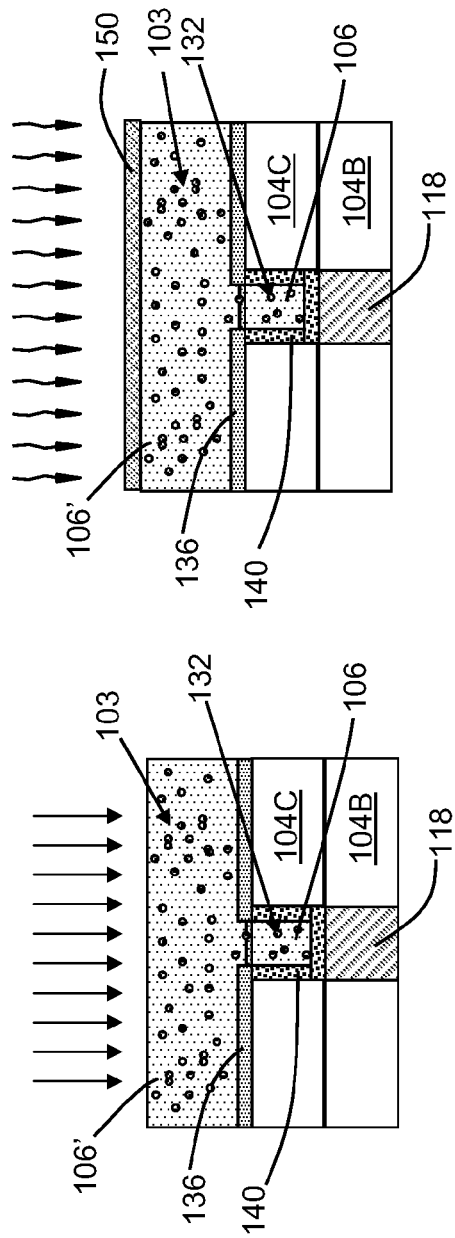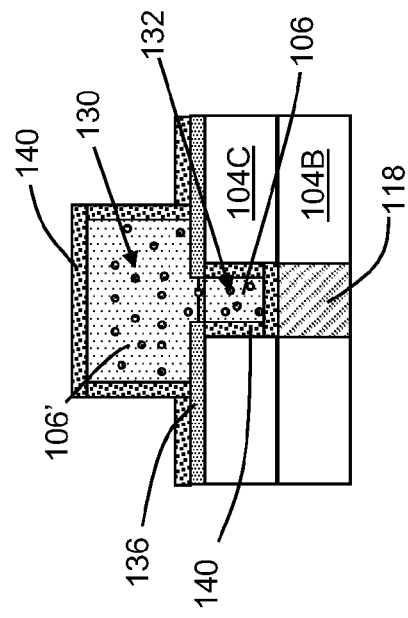

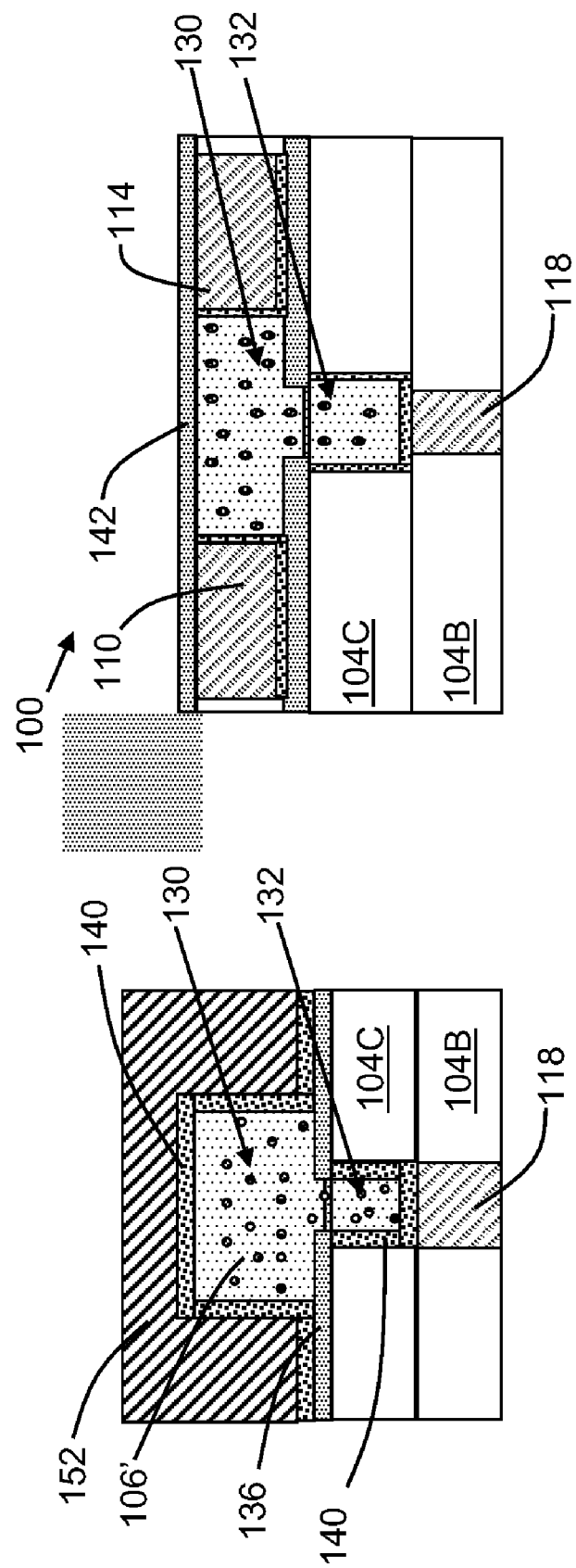

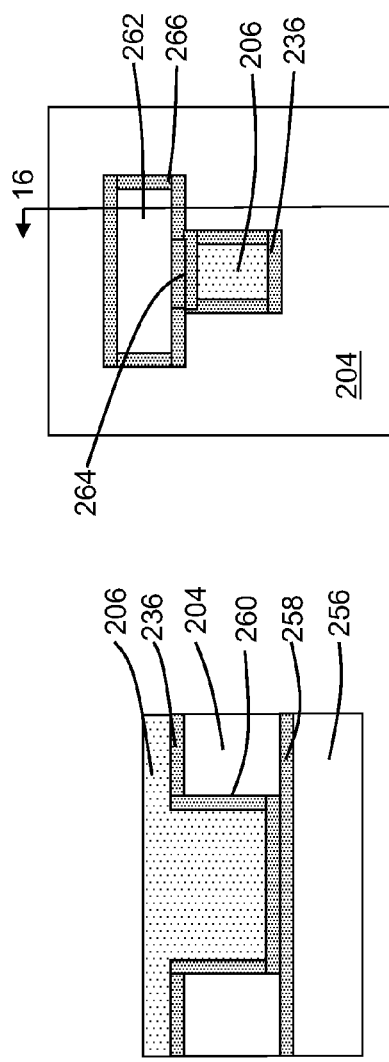
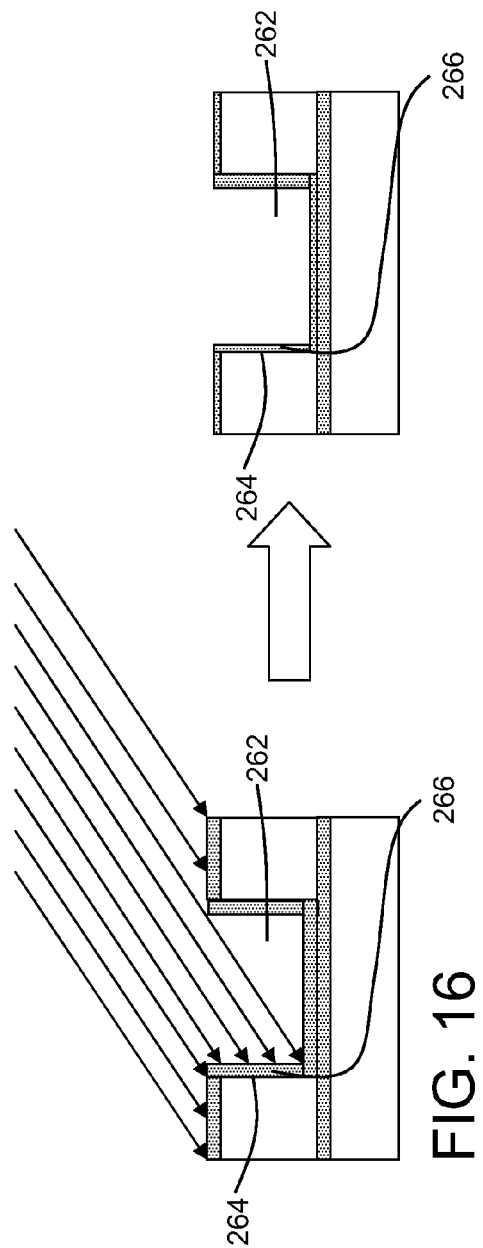

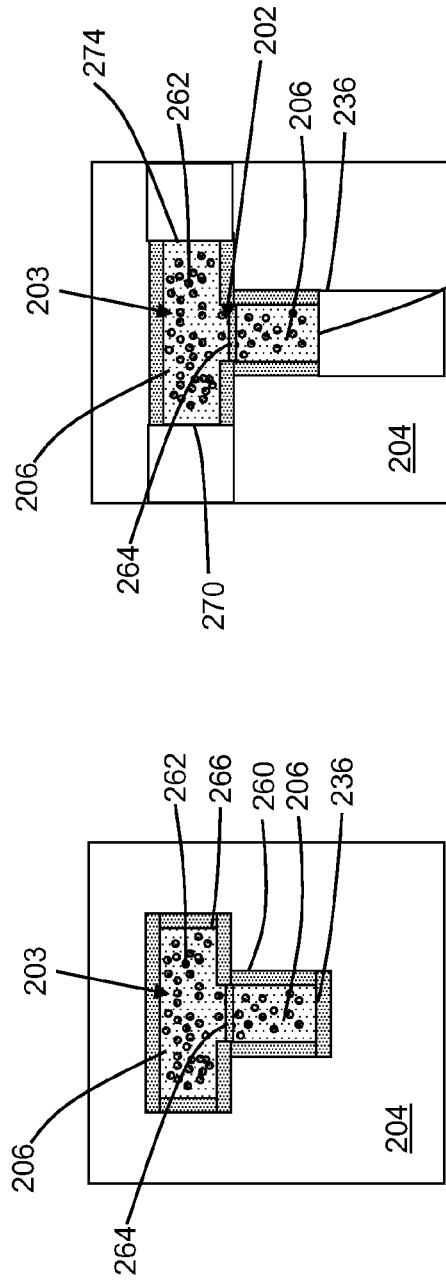
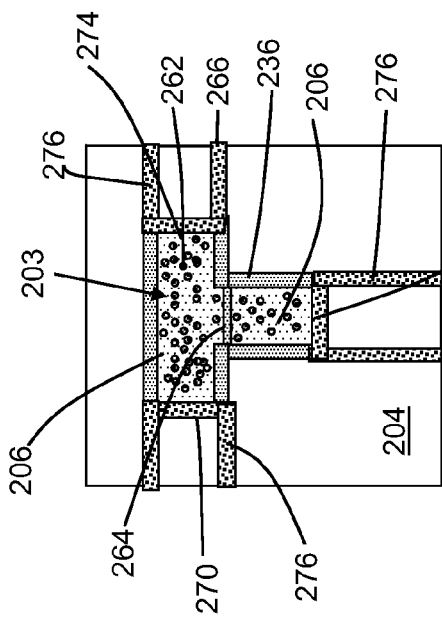
FIG. 17
FIG. 18
FIG. 19

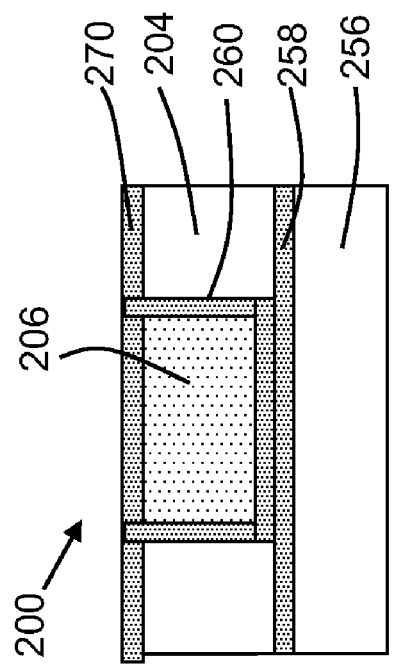
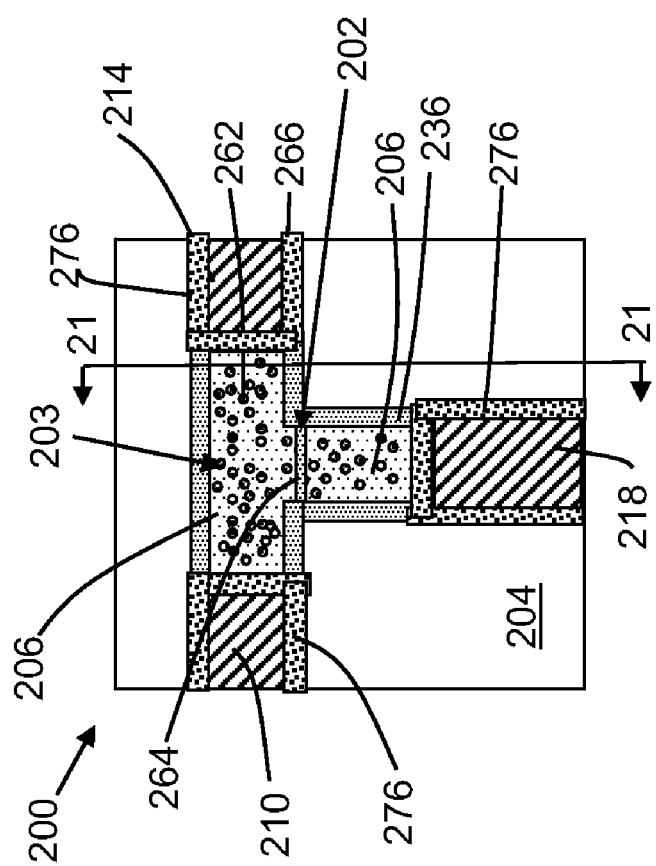

METAL ION TRANSISTOR

BACKGROUND

1. Technical Field

The disclosure relates generally to semiconductor fabrication, and more particularly, to a metal ion transistor and related methods.

2. Background Art

The semiconductor fabrication industry's continued miniaturization of integrated circuit (IC) chips will slow when the size of transistors comes to 16 nanometers. As a result, alternative devices based on entirely different device operation principles are needed to overcome the barrier of traditional scaling. Carbon nanotube and silicon nanowire are two promising replacements for current complementary metal-oxide semiconductor (CMOS) devices. However, too many unknown factors such as yield, reliability, device performance and costs are associated with those devices, and further scaling of such devices is also questionable.

SUMMARY

A metal ion transistor and related methods are disclosed. In one embodiment, the metal ion transistor includes a cell positioned in at least one isolation layer, the cell including a metal ion doped low dielectric constant (low-k) dielectric material sealed from each adjacent isolation layer; a first electrode contacting the cell on a first side; a second electrode contacting the cell on a second side; and a third electrode contacting the cell on a third side, wherein each electrode is isolated from each other electrode.

A first aspect of the disclosure provides a metal ion transistor comprising: a cell positioned in at least one isolation layer, the cell including a metal ion doped low dielectric constant (low-k) dielectric material sealed from each adjacent isolation layer; a first electrode contacting the cell on a first side; a second electrode contacting the cell on a second side; and a third electrode contacting the cell on a third side, wherein each electrode is isolated from each other electrode.

A second aspect of the disclosure provides a method comprising: forming a first electrode in a first isolation layer; forming a second isolation layer over the first isolation layer; forming a first cell region of a low dielectric constant (low-k) dielectric over the first electrode in the second isolation layer, the first cell region isolated from the second isolation layer; forming a cap layer over the second isolation layer and the first cell region, at least thinning the cap layer over the first cell region; depositing a layer of the low-k dielectric over the second isolation layer and the first cell region; forming metal ions in the low-k dielectric layer; patterning the low-k dielectric layer to form a second cell region; sealing the second cell region using a liner; and forming a second electrode contacting the second cell region and a third electrode contacting the second cell region.

A third aspect of the disclosure provides a method comprising: providing an isolation layer; forming a first cell opening in the isolation layer; depositing a first barrier layer in the first cell opening; forming a low dielectric constant (low-k) dielectric in the first cell opening; forming a second cell opening in the isolation layer that exposes the first cap layer at a position; depositing a second barrier layer in the second cell opening including over the position of the first cap layer; etching to at least thin at least one of the first cap layer and the second cap layer at the position; forming the low-k dielectric in the second cell opening; forming metal ions in the low-k dielectric in the first and second cell opening; patterning the low-k dielectric layer to form a cell including removing the first or second cap layer at three positions that are isolated from each other; sealing the three positions using a barrier layer; and forming a first, second and third electrode, each electrode contacting one of the three positions of the cell.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 1-4 show cross-sectional views of a first embodiment of a metal ion transistor according to the disclosure.

FIG. 5 shows top view of a second embodiment of a metal ion transistor according to the disclosure.

FIGS. 6-13 show embodiments of a method of forming the metal ion transistor of FIGS. 1-4.

FIGS. 14-21 show embodiments of a method of forming the metal ion transistor of FIG. 5.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
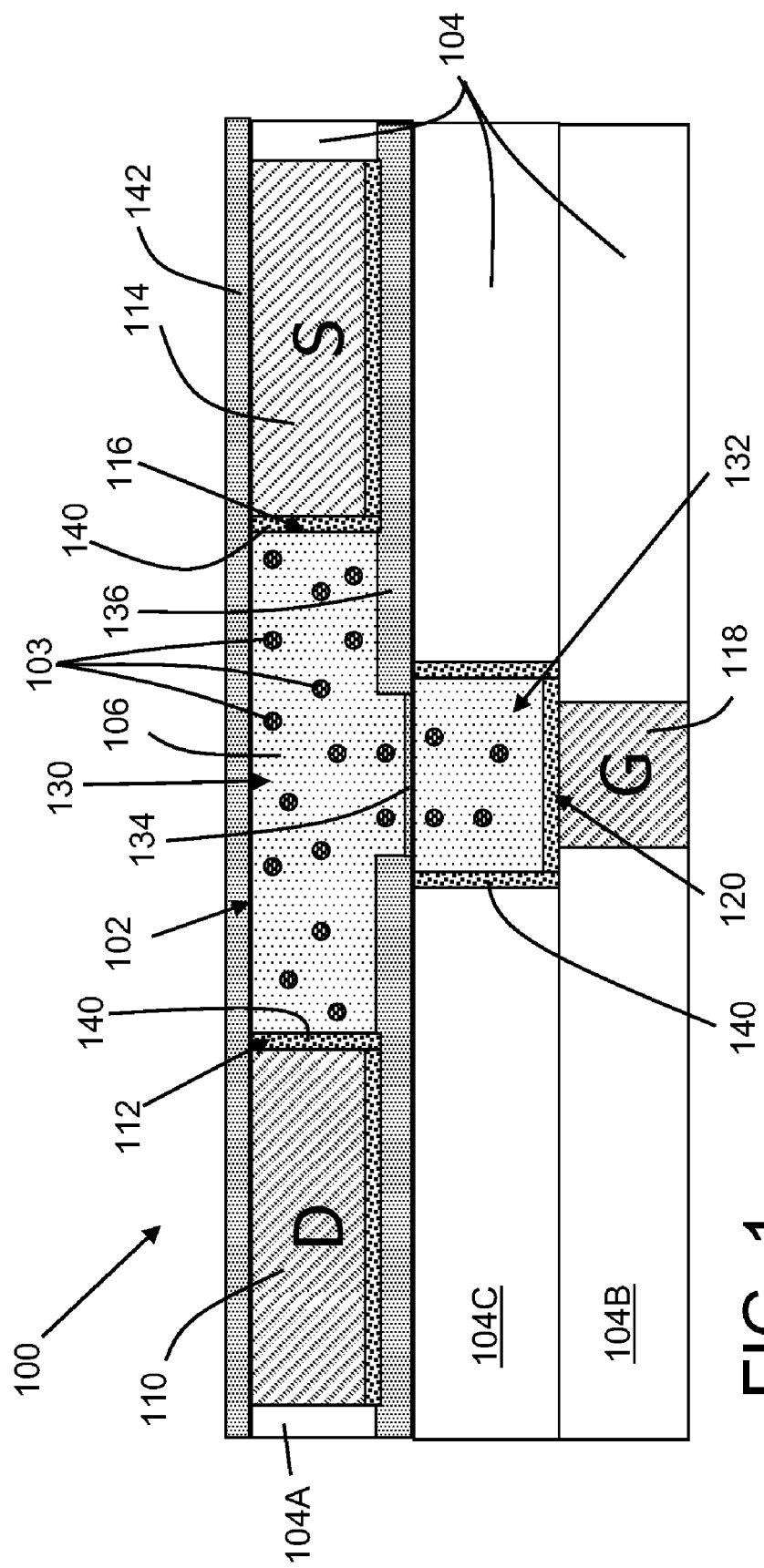

A new type of transistor based on entirely different device configuration and operation principles is disclosed herein. In particular, a metal ion transistor as described herein is based on migration behavior of metal ions such as copper (Cu) ions and leakage behavior of doped low dielectric constant (low-k) materials. As Cu/low-k back-end-of-line (BEOL) technology is a matured technology, a metal ion transistor according to the disclosure has a more realistic potential to succeed than carbon nanotube and silicon nanowire have for massive production. (BEOL refers to any processing operations performed on the semiconductor wafer in the course of device manufacturing following first metallization.) Furthermore, the metal ion transistor has inherent interconnect programmability for various circuit applications and could be stacked up with no silicon (Si) surface real estate consumption for ultrahigh device density per chip application.

FIG. 1 shows a cross-sectional view of one embodiment of a metal ion transistor 100 according to the disclosure. Metal ion transistor 100 includes a cell 102 positioned in at least one isolation layer 104 (three shown). Cell 102 includes a metal ion 103 doped low dielectric constant (low-k) dielectric material 106 sealed from each adjacent isolation layer 104. Low-k dielectric material 106 may include, for example, 2-amino-4, 5-imidazoledicarbonitrile (AIDCN), SiLK, SiCOH, benzocyclobutene (BCB) (a spin-on low-k dielectric material), polyarylethers (such as PAE-2, another spin-on low-k dielectric material available from Schumacher). PAE-2 or any other spin-on and chemical vapor deposition dielectrics having k<3.9. Lower k materials usually are less dense than higher k materials, and therefore metal ions can drift faster in lower k materials to exhibit a better device speed. Metal ions 103 may include any possible ions formed from various metals, for example, positively charged ions of copper (Cu). Cu metal ions are a unidirectional, fast diffuser in low-k dielectric under an electric field, and Cu ion doped low-k material 106 has much higher leakage due to its conductive percolation path between two electrodes. Other ions such as sodium (Na+) or potassium (K+) ions also could be used. Further, metal ion transistor 100 includes a first electrode 110 (e.g., drain (D)) contacting cell 102 on a first side 112, a second electrode 114 (e.g., source (S)) contacting cell 102 on a second side 116, and a third electrode 118 (e.g., gate (G)) contacting cell 102 on a third side 120. Each electrode 110, 114, 118 is isolated from each other electrode by insulator layers of 104, 106, and 136. Each electrode 110, 114, 118 could include any metal such as copper (Cu), aluminum (Al), tungsten (W), titanium (Ti), etc. If a copper (Cu) electrode is used, a refractory metal liner 140 (e.g., tantalum, tantalum nitride, titanium nitride, titanium silicon nitride, tungsten nitride, etc.) should be used to encapsulate the Cu electrode.

In the FIG. 1 embodiment, at least two isolation layers 104 are used, with first electrode 110 and second electrode 114 positioned in a first isolation layer 104A and third electrode 118 positioned in a second isolation layer 104B. As a result, cell 102 is vertically oriented such that it has an upper cell region 130 and a lower cell region 132 (as oriented in the figures), which may be separated by a thinned cap layer 134, e.g., of silicon nitride ($Si_3N_4$). Lower cell region 132 may be positioned in a different isolation layer 104C compared to upper cell region 130. Cap layer 134 may be at least thinned, as will be described herein, compared to a cap layer 136 that separates isolation layers 104A, 104B and/or cell 102, e.g., over lower cell region 132.

Each isolation layer 104 may be positioned in a back-end-of-line (BEOL) layer of an integrated circuit, i.e., no silicon is required for metal ion transistor 100. As such, each isolation layer 104 may include any now known or later developed interlevel dielectric such as, but not limited to: silicon nitride ($Si_3N_4$), silicon oxide ($SiO_2$), fluorinated $SiO_2$ (FSG), hydrogenated silicon oxycarbide (SiCOH), porous SiCOH, borophoso-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), JSR (a spin-on silicon-carbon contained polymer material available form JSR Corporation), other low dielectric constant (<3.9) material, or layers thereof.

Cell 102 may also be sealed from electrodes 110, 114, 118 by a refractory metal liner 140 and from each isolation layer 104 and/or electrodes 110, 114, 118 by cap layer 136 and a cap layer 142. The refractory metal may be selected from ruthenium (Ru), tantalum (Ta), titanium (Ti), tungsten (W), iridium (Ir), rhodium (Rh) and platinum (Pt), etc., or mixtures of thereof. Cap layer 142, similar to cap layer 136, may seal an upper surface of metal ion transistor 100.

Turning to FIGS. 2-3, operation of metal ion transistor 100 as a switch will now be described. As shown in FIG. 2, in order to achieve an on state of the switch (i.e., transistor 100), a positive charge is applied to one of the electrodes (118 as shown) and a negative charge is applied to the other two of the electrodes (110, 114 as shown) causing the positively charged metal ions 103 to disperse throughout cell 102 so as to make cell 102 conductive, i.e., less resistive. Alternatively, as shown in FIG. 3, in order to achieve an off state of the switch (i.e., transistor 100), a negative charge is applied to one of the electrodes (118 as shown) and a positive charge is applied to the other two of the electrodes (110, 114 as shown) causing the positively charged metal ions 103 to collect within cell 102 adjacent to the negatively charged electrode (cell region 102 adjacent electrode 118 as shown) so as to make cell 102 non-conductive, i.e., more resistive. One with skill in the art will recognize that the particular two electrodes that are electrically connected can vary depending on which one is positively charged. Metal ion 103 flow is shown by the darker arrow.

Referring to FIG. 4, metal ion transistor 100 may also function as an inverter. That is, in order to achieve an on state between first electrode 110 and third electrode 118, a positive charge is applied to second electrode 114 causing positively charged metal ions 103 to disperse in cell 102 adjacent to first electrode 110 and third electrode 118 so as to make cell 102 conductive, i.e., less resistive, between first electrode 110 and third electrode 118. One with skill in the art will recognize that the particular two electrodes that are electrically connected can vary depending on which one is positively charged.

FIG. 5 shows a top view of another embodiment of a metal ion transistor 200 according to the disclosure. In this embodiment, a single isolation layer 204 is provided in which a cell 202 and each of first, second and third electrodes 210, 214, 218 are positioned. That is metal ion transistor 202 is substantially planar. Metal ion transistor 200 is otherwise substantially similar to metal ion transistor 100 in structure and function.

Turning to FIGS. 6-13, embodiments of a method of forming metal ion transistor 100 of FIG. 1 according to the disclosure are illustrated. Unless otherwise stated, the materials used are as described above relative to FIGS. 1-5. FIG. 6 shows an initial structure including isolation layer 104B having electrode 118 formed therein. Electrode 118 may be formed using any now known or later developed CMOS processes, for example, by forming an opening, depositing a liner (not shown), depositing a metal (e.g., Cu) and planarizing. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. FIG. 6 also shows forming second isolation layer 104C over first isolation layer 104B, e.g., by depositing an interlevel dielectric.

FIG. 7 shows forming a first cell region 132 of a low dielectric constant (low-k) dielectric 106 over first electrode 118 in second isolation layer 104C. This process may include, for example, forming an opening in isolation layer 104C, depositing refractory metal liner 140, depositing low-k dielectric 106 and planarizing low-k dielectric 106 and refractory metal liner 140 to isolation layer 104C. Liner 140 isolates first cell region 132 from isolation layer 104C.

In FIG. 8, a cap layer 136 is formed (e.g., deposited) over isolation layer 104C and first cell region 132, and cap layer 136 is at least thinned (and perhaps removed) (to thinner cap layer 134) over first cell region 132, e.g., by a reactive ion etch (RIE etch). In an alternative embodiment, cap layer 136 may be removed over first cell region 132. FIG. 9 shows depositing a layer of low-k dielectric 106' over isolation layer 104C and first cell region 132. This layer of low-k dielectric 106' is typically identical to that in isolation layer 104C.

FIGS. 1A-B show alternative embodiments of forming metal ions 103 in layer of low-k dielectric layer 106'. In one embodiment, shown in FIG. 10A, metal ions 103 may be implanted into low-k dielectric 106', 106. Any now known or later developed ion implanting technique may be employed, e.g., ion beam scan, plasma implanting, etc. In FIG. 10B, metal ions 103 are formed by depositing a metal layer 150 (e.g., copper) over layer of low-k dielectric layer 106' and annealing to drive metal ions 103 into low-k dielectric 106', 106. Metal layer 150 may then be removed. Note, that in either embodiment, metal ions 103 also penetrate to first cell region 132.

In FIG. 11, low-k dielectric layer 106' is patterned to form a second cell region 130, which is then sealed using refractory metal liner 140. Patterning may include any now known or later developed technique, e.g., depositing a photoresist, patterning the photoresist, etching the photoresist and etching low-k dielectric layer 106'.

FIGS. 12-13, show forming second electrode 110 contacting second cell region 130 and third electrode 114 contacting second cell region 130, i.e., via liner 140. In one embodiment, as shown in FIG. 12, a metal layer 152 (e.g., copper) is deposited over second cell region 130, and then planarized (e.g., chemical mechanical polishing (CMP)), as shown in FIG. 13, to expose second cell region 132 and form electrodes 110, 114. Cap layer 142 (e.g., silicon nitride) may then be deposited to seal second cell region 132 and electrodes 110, 114, resulting in metal ion transistor 100.

Referring to FIGS. 14-21, embodiments of a method of forming metal ion transistor 200 of FIG. 5 according to the disclosure are shown. Unless otherwise stated, the materials used are as described above relative to FIGS. 1-5. In these embodiments, as shown in FIG. 14, an isolation layer 204 is provided, in which a first cell opening 260 (gate region) is formed using any now known or later developed methods, e.g., photolithography, etching, etc. An underlying isolation layer 256 insulated from isolation layer 204 by a barrier layer 258 (e.g., silicon nitride) is also shown. FIG. 14 also shows depositing a first cap layer 236 (e.g., silicon nitride) in first cell opening 260, and forming (e.g., depositing) a low dielectric constant (low-k) dielectric 206 in first cell opening 260.

As shown in the top view of FIG. 15, after gate cell formation, a second cell (channel region) opening 262 is then formed in isolation layer 206 that exposes first cap layer 236 at a position 264. A second cap layer 266 is deposited in second cell opening 262 including over position 264 of first cap layer 236. FIG. 16 shows a cross-sectional view along line 16-16 in FIG. 15 of etching to at least thin (and perhaps remove) at least one of first cap layer 236 and second cap layer 266 at position 264. In one embodiment, the etching may include performing a directional reactive ion etch (RIE). Alternatively, first cap layer 236 and second cap layer 266 may be removed at position 264.

FIG. 17 shows a top view after forming low-k dielectric 206 in second cell opening 262, and forming metal ions 203 in low-k dielectric 206 in first 260 and second cell opening 262. As described above, metal ions 203 may be formed by implanting the metal ions into low-k dielectric 206, or by depositing a metal layer over low-k dielectric 206 and annealing to drive metal ions 203 into low-k dielectric layer 206.

FIG. 18 shows patterning low-k dielectric layer 206 to form a cell 202 including removing first 236 or second cap layer 266 at three positions 270, 272, 274 that are isolated from each other, e.g., by photolithography and etching. FIG. 19 shows sealing three positions 270, 272, 274 using a refractory metal liner 276. FIG. 20 shows forming a first 210, second 214 and third 218 electrode, each electrode contacting one of the three positions of the cell, i.e., via liner 276. The electrode forming may include, for example, depositing a metal layer over liner 276, planarizing the metal layer to expose low-k dielectric 206 and form first 210, second 214 and third 218 electrodes. As shown in the cross-sectional view of FIG. 21, a cap layer 270 (e.g., silicon nitride) may be formed over low-k dielectric 206 and the electrodes, to seal metal ion transistor 200.

Metal ion transistor 100, 200 may be formed in any BEOL layer, are stackable therein and compatible with conventional CMOS technology. Metal ion transistor 100, 200 may function as a reprogrammable switch or an inverter, and can be formed with high density and high performance. For example, the on-time under the same E-field and room temperature (RT) for a 100 nm dielectric via height has been calculated for the following low-k dielectrics as follows: AIDCN=0.028 seconds (s); SiLK=20 ns; BCB=0.2 ns; and PAE-2=200 ns. Furthermore, metal ion transistor 100, 200 do not require any silicon, and can be made on practically any isolation layer material. In contrast to conventional transistors, metal ion transistor 100, 200 exhibits a negative temperature coefficient of performance in which a higher operating temperature provides faster device switching speed due to the nature of metal ion transistor operation associated with ion movement.

The device as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A metal ion transistor comprising:
a cell positioned in at least one isolation layer, the cell including a metal ion doped low dielectric constant (low-k) dielectric material, sealed from each adjacent isolation layer, wherein the cell includes at least two distinct regions of the dielectric material separated by a cap layer including silicon nitride;
a first electrode contacting the cell on a first side;
a second electrode contacting the cell on a second side; and
a third electrode contacting the cell on a third side,
wherein each electrode is isolated from each other electrode.

2. The metal ion transistor of claim 1, wherein the metal ion transistor includes a switch and the metal ions are positively charged, and wherein:
in order to achieve an on state of the switch, a positive charge is applied to one of the electrodes and a negative charge is applied to the other two of the electrodes causing metal ions to disperse throughout the cell so as to make the cell conductive; and
in order to achieve an off state of the switch, a negative charge is applied to one of the electrodes and a positive charge is applied to the other two of the electrodes causing metal ions to collect within the cell adjacent to the negatively charged electrode so as to make the cell non-conductive.

3. The metal ion transistor of claim 1, wherein the metal ion transistor includes an inverter and the metal ions are positively charged, and wherein:
in order to achieve an on state between the first electrode and the second electrode, a positive charge is applied to the third electrode causing metal ions to disperse in the cell adjacent to the first electrode and the second electrode so as to make the cell conductive between the first electrode and the second electrode.

4. The metal ion transistor of claim 1, wherein the at least one isolation layer includes at least two isolation layers, with the first electrode and the second electrode positioned in a first isolation layer and the third electrode positioned in a second isolation layer, and wherein the cell is vertically oriented.

5. The metal ion transistor of claim 1, wherein the at least one isolation layer includes a single isolation layer in which the cell and the first, second and third electrodes are positioned.

6. The metal ion transistor of claim 1, wherein each isolation layer is positioned in back-end-of-line layer of an integrated circuit.

7. The metal ion transistor of claim 1, wherein the cell is sealed from the electrodes by a refractory metal liner.

8. The metal ion transistor of claim 1, wherein the low-k dielectric is selected from the group consisting of: 2-amino-4,5-imidazoledicarbonitrile (AIDCN), SiLK, SiCOH, benzocyclobutene (BCB) and polyarylethers.

9. The metal ion transistor of claim 1, wherein the at least one isolation layer includes a back-end-of-line (BEOL) of an integrated circuit (IC) chip.

10. The metal ion transistor of claim 9, wherein the metal ion transistor is stackable within the BEOL.

11. The metal ion transistor of claim 1, wherein the metal ions are selected from the group consisting of: copper (Cu), sodium (Na) and potassium (K).

12. The metal ion transistor of claim 1, wherein the metal ion transistor exhibits a negative temperature coefficient of performance such that as an operating temperature of the metal ion transistor increases, a device switching speed increases.

13. The metal ion transistor of claim 1, wherein the cap layer includes a first portion having a first thickness and a second portion having a second thickness distinct from the first thickness.

* * * * *